(12) United States Patent
Morad et al.

(10) Patent No.: US 6,357,143 B2
(45) Date of Patent: Mar. 19, 2002

(54) METHOD AND APPARATUS FOR HEATING AND COOLING SUBSTRATES

(75) Inventors: Ratson Morad, Palo Alto; Ho Seon Shin, Mountain View; Robin Cheung, Cupertino; Igor Kogan, San Francisco, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/909,915

(22) Filed: Jul. 20, 2001

Related U.S. Application Data (60) Division of application No. 09/396,007, filed on Sep. 15, 1999, now Pat. No. 6,276,072, which is a continuation-in-part of application No. 08/891,048, filed on Jul. 10, 1997, now Pat. No. 6,182,376.

(51) Int. Cl.[7] .................................................. F26B 7/00
(52) U.S. Cl. .............................. 34/412; 34/92; 34/418
(58) Field of Search .......................... 34/403, 412, 418, 34/92, 187, 289, 290; 219/121.43, 121.58; 204/192.1, 298.35; 156/345

(56) References Cited

U.S. PATENT DOCUMENTS

| | | | |
|---|---|---|---|
| 4,816,638 A | 3/1989 | Ukai et al. ............. 219/121.43 |
| 4,854,263 A | 8/1989 | Chang et al. ................ 118/715 |
| 5,314,541 A | 5/1994 | Saito et al. .................. 118/725 |
| 5,374,594 A | 12/1994 | van de Ven et al. ......... 438/758 |
| 5,377,425 A | 1/1995 | Kawakami et al. ............. 34/92 |
| 5,478,429 A | 12/1995 | Komino et al. .............. 156/345 |
| 5,665,167 A | 9/1997 | Degushi et al. .............. 118/728 |
| 5,673,750 A * | 10/1997 | Tsubone et al. ............. 165/275 |
| 5,716,207 A | 2/1998 | Mishina et al. ............. 432/253 |
| 5,884,009 A | 3/1999 | Okase ......................... 392/418 |
| 6,004,047 A | 12/1999 | Akimoto et al. ............ 396/604 |
| 6,062,852 A | 5/2000 | Kawamoto et al. ......... 432/258 |
| 6,182,376 B1 * | 2/2001 | Shin et al. ..................... 34/418 |
| 6,276,072 B1 * | 8/2001 | Morad et al. .................. 34/428 |

OTHER PUBLICATIONS

A. Fujie, "Study on Practical Service on Acoustic Levitation and Transportation System of Silicon Wafer," pp. 214–224.
Y. Yagai et al., "Ultra Clean N2 Gas Environment Wafer Transport System Large Size Wafer," pp. 225–233.
D.R. Wright et al., "Low temperature etch chuck: Modeling and experimental results of heat transfer and wafer temperature," J.Vac.Sci.Technol.A. 10(4), Jul./Aug. 1992, pp. 1065–1070.

* cited by examiner

Primary Examiner—Pamela Wilson
(74) Attorney, Agent, or Firm—Dugan & Dugan (57) ABSTRACT

A method and apparatus for heating and cooling a substrate. A chamber is provided that comprises a heating mechanism adapted to heat a substrate positioned proximate the heating mechanism, a cooling mechanism spaced from the heating mechanism and adapted to cool a substrate positioned proximate the cooling mechanism, and a transfer mechanism adapted to transfer a substrate between the position proximate the heating mechanism and the position proximate the cooling mechanism.

40 Claims, 5 Drawing Sheets

METHOD AND APPARATUS FOR HEATING AND COOLING SUBSTRATES

This application is a division of U.S. patent application Ser. No. 09/396,007, filed Sep. 15, 1999, titled "METHOD AND APPARATUS FOR HEATING AND COOLING SUBSTRATES", now U.S. Pat. No. 6,276,072 which is a continuation-in-part of U.S. Ser. No. 08/891,048, filed Jul. 10, 1997 now U.S. Pat. No. 6,182,376 B1, issued Feb. 6, 2001, titled "DEGASSING METHOD AND APPARATUS".

FIELD OF THE INVENTION

The present invention relates generally to semiconductor device manufacturing and more specifically to a method and apparatus for heating and cooling substrates.

BACKGROUND OF THE INVENTION

Semiconductor wafers, flat panel displays and other similar substrates typically have numerous material layers deposited thereon during device fabrication. Some commonly deposited layers (e.g., spin-on glass (SOG) films) may contain contaminants, defects or undesirable microstructures that can be reduced in number or altogether removed by heating or "annealing" the substrate at an appropriate temperature for an appropriate time. Other deposited layers (e.g., copper films) may have properties that undesirably change over time or "self-anneal", resulting in unpredictable deposited layer properties (e.g., unpredictable resistivity, stress, grain size, hardness, etc.). As with contaminants, defects and undesirable microstructures, deposited layer properties often can be stabilized by a controlled annealing step (e.g., for copper films, a 200–400° C., 15 second–3 minute anneal in a gas such as $N_2$ or about 96% $N_2$, 4% $H_2$). Following any annealing step, a substrate preferably is rapidly cooled so that other processes can be performed on the substrate without delay (i.e., to increase throughput).

Conventionally annealing is performed within a quartz furnace that must be slowly pre-heated to a desired annealing temperature, or within a rapid thermal process (RTP) system that can be rapidly heated to a desired annealing temperature. Thereafter an annealed substrate is transferred to a separate cooling module which conventionally employs a cooled substrate support and is slightly backfilled with a gas such as argon to enhance thermal conduction. The separate cooling module increases equipment cost and complexity, as well as equipment footprint, and decreases substrate throughput by requiring substrate transfer time between the heating and cooling systems. Accordingly, a need exists for an improved method and apparatus for heating and cooling substrates that is less expensive, less complex, and has a reduced equipment footprint and increased throughput when compared to conventional substrate heating and cooling systems.

SUMMARY OF THE INVENTION

To overcome the needs of the prior art, an inventive chamber is provided that allows for rapid heating and cooling of a substrate within a single chamber. As no transfer time to a separate cooling module is required, the invention decreases equipment cost, complexity and footprint while increasing substrate throughput. Specifically, the inventive chamber includes a heating mechanism adapted to heat a substrate positioned proximate the heating mechanism, a cooling mechanism spaced from the heating mechanism and adapted to cool a substrate positioned proximate the cooling mechanism, and a transfer mechanism adapted to transfer a substrate between a position proximate the heating mechanism and a position proximate the cooling mechanism. As used herein "proximate" means close enough to affect sufficient thermal energy transfer for either heating or cooling a substrate. The heating mechanism and the cooling mechanism preferably are separated by about 1 to 5 inches.

The heating mechanism preferably comprises a heated substrate support adapted to support a substrate and to heat the supported substrate to a predetermined temperature, and the cooling mechanism preferably comprises a cooling plate (e.g., a water cooled cooling plate or a refrigerant cooled cooling plate). A plurality of holes may be provided within the cooling plate that allow a gas to flow through the cooling plate (so as to cool the gas) before the gas strikes a substrate positioned proximate the cooling plate.

The transfer mechanism transfers a substrate from a position proximate the heating mechanism to a position proximate the cooling mechanism, and preferably employs only single-axis, linear motion so as to further reduce equipment complexity and cost. The transfer mechanism may comprise, for example, a wafer lift hoop having a plurality of fingers adapted to support a substrate, or a plurality of wafer lift pins. A dry gas source may be coupled to the chamber in order to supply a dry gas thereto. The chamber includes a pump adapted to evacuate the chamber to a predetermined pressure (e.g., about 20 and 200 Torr) during cooling, as the present inventors have found that a reduced chamber pressure provides good thermal conduction for short distances (so that a substrate positioned proximate the cooling mechanism is cooled thereby) but poor thermal conduction for large distances (so that a substrate being cooled by being positioned proximate the cooling mechanism is not also heated by the distantly located heating mechanism).

As is apparent from the above description, the invention provides a method for efficiently heating (e.g., annealing, degassing, etc.) and cooling a substrate within a single chamber. Wafer transfer time is reduced, footprint is reduced and simpler wafer movements are employed.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
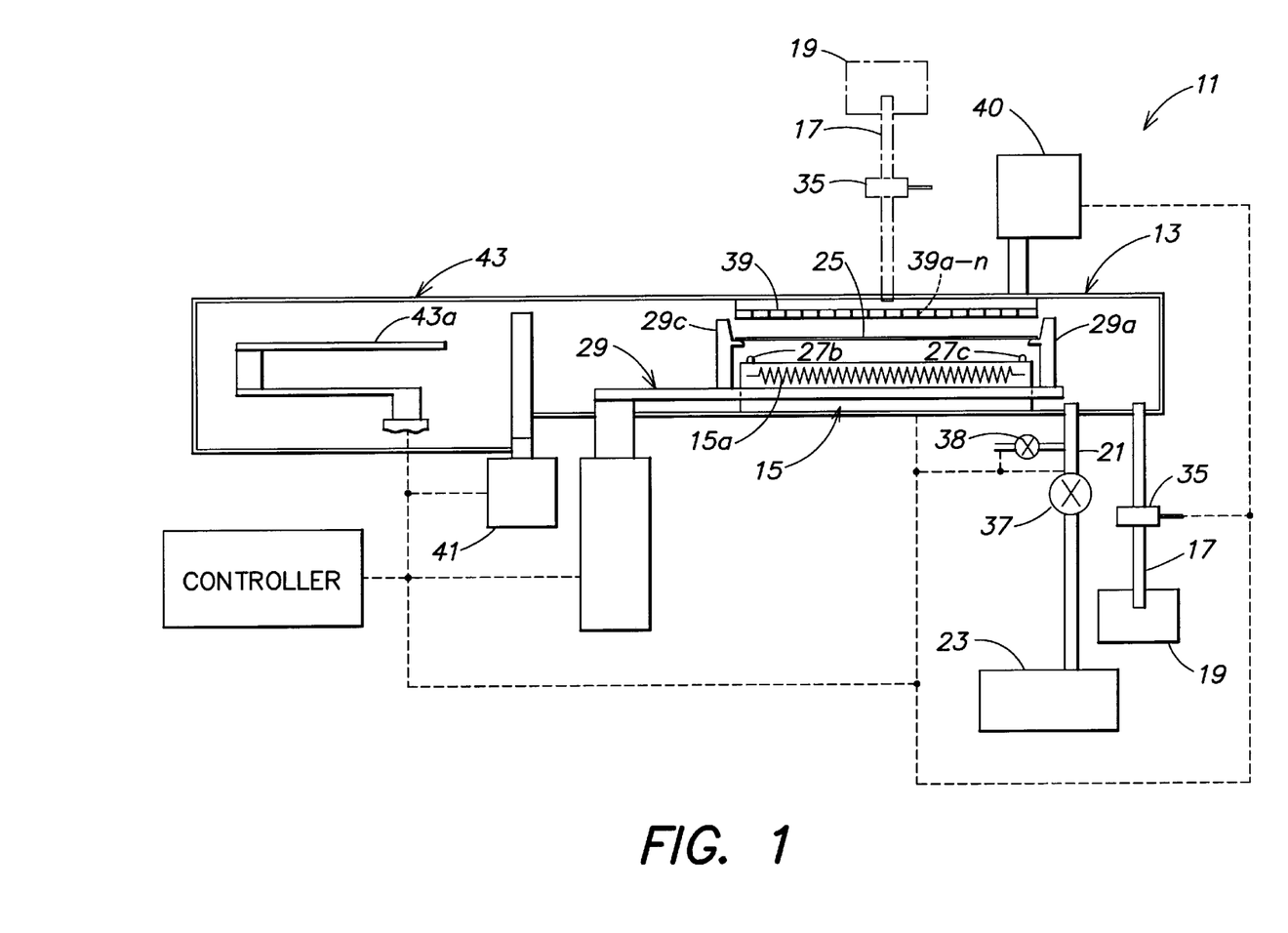
FIG. 1 is a side elevational view of a heating and cooling apparatus configured in accordance with the invention.

FIG. 1 is a side elevational view of a heating and cooling apparatus 11 configured in accordance with the present invention. In order to conveniently describe the inventive apparatus 11, its components will be described with reference to an object to be heated and cooled. However, it will be understood that the object itself is not a part of the apparatus.

As shown in FIG. 1, the heating and cooling apparatus 11 comprises a chamber 13 containing a heated substrate support 15 (e.g., a substrate support having a resistive heating element 15a therein). The chamber 13 preferably has a small volume of about 5–20 liters to allow for rapid evacuation of the chamber (described below) and reduced process gas consumption. The heated substrate support 15 may comprise any conventional heated substrate support (e.g., a stainless steel substrate support) having a temperature range sufficient for the process to be performed (typically about 150–600° C. for most annealing applications). A gas inlet 17 couples a dry gas source 19 (such as a noble gas or nitrogen, preferably 100% $N_2$ having fewer than a few parts per million of $O_2$ therein, or 4% or less of $H_2$ diluted in $N_2$ and having fewer than a few parts per million of $O_2$ therein) to the chamber 13. The gas emitted from the dry gas source 19 may be further "dried" via a getter or cold trap (not shown) within the gas inlet 17. A gas outlet 21 couples the chamber 13 to a vacuum pump 23 which, in operation, pumps gas from the chamber 13.

Figure 2:
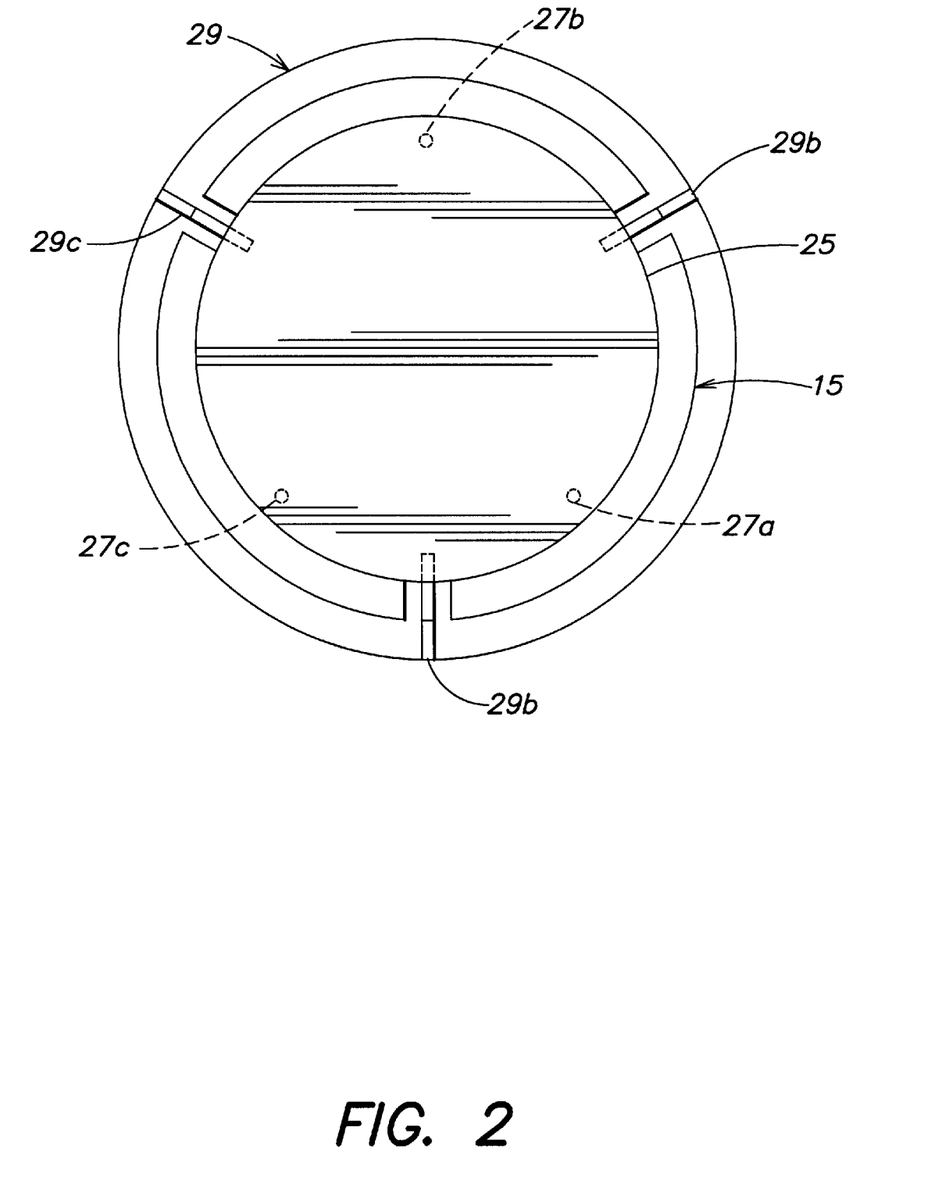
FIG. 2 is a top elevational view of the substrate support of the heating and cooling apparatus of FIG. 1.

A semiconductor wafer 25 may be placed directly on the heated substrate support 15; or optionally, a plurality of pins 27 (preferably 3–6 pins, most preferably three pins 27a–c as shown in FIGS. 1 and 2) which extend from the substrate support 15, support the wafer 25 so as to facilitate gas flow along the backside of the wafer 25 and so as to reduce contact between the wafer 25 and the substrate support 15 (thereby reducing particle generation by such contact). Short pin heights facilitate heat transfer from the substrate support 15 to the wafer 25; preferably the pins 27a–c are between 0.005–0.02 inches in height. The positioning of the plurality of pins 27 can be seen with reference to FIG. 2 which shows the heated substrate support 15 from a top plan view. To improve substrate temperature uniformity during heating, the diameter of the heated substrate support 15 preferably is larger than the diameter of the substrate being heated (e.g., a nine inch substrate support is preferred for heating an eight inch substrate). The heated substrate support 15 heats the wafer 25 primarily by conduction (e.g., either direct contact conduction if a substrate touches the heated substrate support 15 or conduction through a dry gas such as nitrogen disposed between the substrate support 15 and a substrate when the substrate rests on the pins 27). A convective heating component also may be employed if gas is flowed along the backside of the wafer 25 during heating. However, the addition of a convective heating component, such as a backside gas flow, during substrate heating has been found to have minimal impact on heating time due to the short heating times typically employed (e.g., about 15 seconds to a few minutes) and the small gap between the wafer 25 and the heated substrate support 15 (e.g., 0.005–0.02 inches). The use of a backside gas flow also may require wafer clamping (e.g., via a partial/full clamp ring or via an electrostatic chuck as are known in the art) so as to prevent wafer movement due to the gas flow.

In order to easily place a wafer on and extract a wafer from the heated substrate support 15, a conventional 3–6 finger wafer lift hoop 29 (the operation of which is well known in the art) or the like is employed. The wafer lift hoop 29 extends and retracts from the substrate support 15 (e.g., via a servo or stepper motor) and is of the type having at least three fingers (represented by reference numbers 29a–c), that extend under the edge of the wafer 25. Thus, during wafer lifting and lowering, wafer contact is limited to the area above the three fingers 29a–c, and fewer particles are generated. The specific details of the preferred configuration for the fingers 29a–c are described in parent application, U.S. Pat. No. 6,182,376 B1, issued Feb. 6, 2001. Alternatively the pins 27a–c may be motorized so as to extend and retract to and from the substrate support 15. Preferably the wafer lifting mechanism (e.g., the lift hoop 29 or the pins 27) extend and retract between a position proximate the substrate support 15 and a position proximate the cooling plate 39.

The rate at which the gas flows into the chamber 13 is controlled via a needle valve or flow controller 35 (e.g., a mass flow controller) operatively coupled along the gas inlet 17. Preferably, the vacuum pump 23 comprises a rough-pump, such as a dry pump, having a pumping speed of between about 1–50 liters/sec for rapid evacuation of the chamber 13. The gas outlet 21 comprises an isolation valve 37, such as a pneumatic roughing port valve, operatively coupled to the vacuum pump 23 so as to control the gas flow rate from the chamber 13 and preferably a chamber exhaust valve 38 for use during chamber purging. Because a rough pump is capable of evacuating a chamber to a pressure of a few milliTorr or higher, a rough pump alone may be employed for applications wherein the heating and cooling apparatus 11 is not evacuated below a pressure of a few milliTorr (e.g., when the heating and cooling apparatus 11 is used as a stand-alone module that is vented to atmospheric pressure with a non-oxidizing gas such as nitrogen prior to loading a substrate therein or when a substrate is transferred directly between the heating and cooling apparatus 11 and other process chambers that employ pressures of a few milliTorr or higher). However, for applications that require pressures below a few milliTorr (e.g., pressures which cannot be obtained with a rough pump alone, a high vacuum pump (not shown) such as a cryopump also may be employed to allow substrate transfer between a high vacuum environment and the chamber 13 (e.g., when using the heating and cooling apparatus 11 with a fabrication tool as described below with reference to FIG. 5 or when otherwise directly transferring a substrate between the heating and cooling apparatus 11 and other process chambers that employ pressures below a few milliTorr).

To affect rapid cooling of the wafer 25 following wafer heating within the chamber 13 (described below), a water or refrigerant cooled cold plate 39 (e.g., an aluminum cooling plate that may be cooled to about 5 to 25° C. by a cooling fluid supplied from a cooling fluid source 40) is disposed within the heating and cooling apparatus 11 distant the heated substrate support 15 (e.g., preferably about 1–5 inches therefrom). Because the substrate support 15 and the cold plate 39 preferably are disposed opposite one another, only single-axis, linear motion (e.g., less expensive and less complex motion than multi-axis motion) need be employed to transfer a substrate therebetween. In fact, the wafer lift mechanism (e.g., the wafer lift hoop 29 or the pins 27) may be configured to transfer a wafer between the position proximate the substrate support 15 and the cooling plate 39.

The cold plate 39 preferably employs a diffuser or shower head design as is known in the art, having up to ten thousand 0.02–0.1 inch diameter holes therein (represented by reference numbers 39a–n in FIG. 1). The holes 39a–n allow gas to flow through the cold plate 39 (e.g., from the dry gas source 19) and to thereby be cooled by the cold plate 39 so as to improve cooling of the wafer 25 as described below. The walls of the chamber 13 preferably are water or refrigerant (e.g., a 50% de-ionized water/50% glycol solution having a freezing point below that of pure water) cooled as well to further enhance substrate cooling.

As shown in FIG. 1, the gas inlet 17 is positioned adjacent the heated substrate support 15. However, the gas inlet 17 could alternatively be coupled to the upper portion of the chamber 13 (as shown in phantom) to supply dry gas to the holes 39a–n of the cold plate 39 and/or to a manifold (not shown) having a plurality of openings which diffuse gas emitted from the gas inlet 17 into the chamber 13 and cause a substantially uniform flow of dry gas over the wafer 25's frontside. The design of such a manifold is well known to those of ordinary skill in the art of CVD reactor design. U.S. Pat. No. 4,854,263 entitled "Inlet Manifold and Method for Increasing Gas Dissociation and for PECVD of Dielectric Films" is incorporated herein by this reference, for it teaching of a specific inlet manifold.

Note that because the inventive heating and cooling apparatus 11 employs only a single chamber and employs relatively inexpensive components (e.g., the heated substrate support 15, the water cooled cooling plate 39, preferably single-axis, linear motion for transferring a substrate therebetween, etc.), heating and cooling is economically performed with reduced footprint and increased throughput as the need for substrate transfer time to a separate cooling module is eliminated. A controller C is coupled to the various chamber components (e.g., the heated substrate support 15, the wafer lift mechanism 27 or 29, the flow controller 35, the isolation valve 37, the chamber exhaust valve 38, the cooling fluid source 40, the chamber isolation slit valve 41 and the transfer station wafer handler 43a) and is programmed so as to cause the inventive chamber to perform the inventive method described below.

In operation, prior to placing a wafer 25 within the chamber 13, the chamber 13 is pre-conditioned. For example, the substrate support 15 may be pre-heated to a desired heating temperature (e.g., for annealing or degassing purposes) and the cold plate 39 may be pre-cooled to a desired cooling temperature. Additionally, to pre-condition the chamber 13 to a predetermined contamination level (e.g., so that less than 10 parts per million of $O_2$ resides in the chamber 13) the chamber 13 may be purged at atmospheric pressure by flowing dry gas from the dry gas source 19 into the chamber 13 with the chamber exhaust valve 38 open, may be single-evacuation purged by evacuating the chamber 13 to a predetermined vacuum level via the rough pump 23 (by opening an isolation valve 37 coupled therebetween) and then back filling the chamber 13 with dry gas from the dry gas source 19, or may be cycle purged by repeatedly evacuating the chamber 13 to a predetermined vacuum level and then back filling the chamber 13 with dry gas from the dry gas source 19 to further reduce contamination levels beyond those achievable by atmospheric pressure or single evacuation purging.

As an example, for a copper anneal within the chamber 13, the substrate support is heated to between about 150–600° C., and more preferably to between about 200–400° C., and the cold plate is cooled to between about 5 and 25° C., more preferably to about 15° C. Copper films readily oxidize, particularly at elevated temperatures such as those employed during annealing, and form undesirable copper oxide regions that degrade film resistivity and increase the contact resistance of interconnects fabricated therefrom. Accordingly, the chamber 13's environment preferably is pre-conditioned to contain less than about 10 parts per million of oxygen. For example, by purging or cycle purging the chamber with a dry gas from the dry gas source 19 that comprises $N_2$ having only a few parts per million of oxygen, and more preferably about 96% $N_2$ with 4% $H_2$ having only a few parts per million of oxygen, as a small amount of $H_2$ suppresses oxide formation.

After the chamber 13 is pre-conditioned, a chamber isolation slit valve 41 that couples the chamber 13 to a station for loading a wafer into or unloading a wafer from the chamber 13 (i.e., a transfer station 43) opens and a transfer station wafer handler 43a extends therethrough, carrying the wafer 25 into position above the heated substrate support 15. The transfer station 43 typically is at atmospheric pressure (preferably a nitrogen or other non-oxidizing atmosphere such as an argon atmosphere) and may be constantly purged with nitrogen or any other non-oxidizing gas to reduce the concentration of oxygen that enters the chamber 13 during wafer transfer. Alternatively the transfer station 43 may be at a reduced chamber pressure (e.g., if the heating and cooling apparatus and/or the transfer station 43 is coupled to other process chambers employing reduced pressures) that preferably has a low oxygen partial pressure.

The opening of the slit valve 41 preferably is no larger than the minimum area required to move the wafer 25 and the blade of the wafer handler 43a into or out of the chamber 13, thereby minimizing the impact of the transfer station 43's atmosphere on the chamber 13's atmosphere. To prevent contaminants (e.g., oxygen during copper film annealing) from entering the chamber 13 as the wafer 25 is transferred thereto, the chamber 13 may be purged with dry gas from the dry gas source 19 (typically at a flow rate of about 5–100 s.l.m.) during wafer transfer. This is particularly important when the transfer station 43's atmosphere is not clean (e.g., has a high oxygen concentration or other high impurity concentration that may affect the wafer 25 or films formed thereon during heating or cooling within the chamber 13). The wafer lift hoop 29 (via the three fingers 29a–c) lifts the wafer 25 from the transfer station wafer handler 43a and after the transfer station wafer handler 43a has sufficiently retracted, the slit valve 41 closes and the wafer lift hoop 29 lowers the wafer onto the heated substrate support 15. Preferably the wafer 25 is in direct contact with the substrate support 15 (or with the pins 27a–c) so as to maximize heat transfer therebetween and to minimize wafer heating time. The pressure within the chamber 13 preferably is maintained at about atmospheric pressure in a non-oxidizing gas such as nitrogen either by sealing the chamber 13 from the rough pump 23 (via the isolation valve 37), or by purging the chamber 13 with dry gas with the chamber exhaust valve 38 open or while pumping the chamber 13 with the rough pump 23. Note that the gas pressure within the chamber 13 aids in the transfer of heat from the heated substrate support 15 to the wafer 25 as described in parent application, U.S. Pat. No. 6,182,376 B1, issued Feb. 6, 2001. Chamber pressures of a few Torr or less yield a poor heat conduction path between the wafer 25 and the heated substrate support 15. Thus a wafer backside gas preferably is employed at such reduced chamber pressures (e.g., an argon, helium or nitrogen backside gas with appropriate wafer clamping to prevent wafer movement caused by the backside gas).

An anneal, degas or other heating process thereafter may be employed on the wafer 25 using the substrate support 15. For example, a copper anneal may be performed by maintaining the wafer 25 in contact with the substrate support 15 for about 15 seconds to 3 minutes, depending on the temperature of the heated substrate support 15 and the desired anneal, degas or other heating process duration. To perform a degas process with the heating and cooling apparatus 11 such as the inventive degas process described in parent application, U.S. Pat. No. 6,182,376 B1, issued Feb. 6, 2001, a cryopump or other high vacuum pump preferably is provided in addition to or in place of the rough pump 23 to obtain the low pressures (e.g., $1 \times 10^{-5}$ Torr) required thereof.

Following an annealing, degas or other heating process, the wafer lift hoop 29 elevates, raising the wafer 25 above the heated substrate support 15 to a position proximate the cold plate 39 so as to cool the wafer 25. As described below with reference to FIG. 3, to optimize the cooling rate of the wafer 25, the gap between the top surface of the wafer 25 and the bottom surface of the cold plate 39 preferably is less than about 0.02" or about 0.5 mm, the pressure within the chamber 13 preferably is reduced to between about 20–200 Torr during cooling, and dry gas from the dry gas source 19 may be flowed (e.g., at a rate of about 100–150 s.l.m.) through the cold plate 39 (e.g., via the holes 39*a–n*) to generate a cool dry gas that strikes the top surface of the wafer 25.

Figure 3:
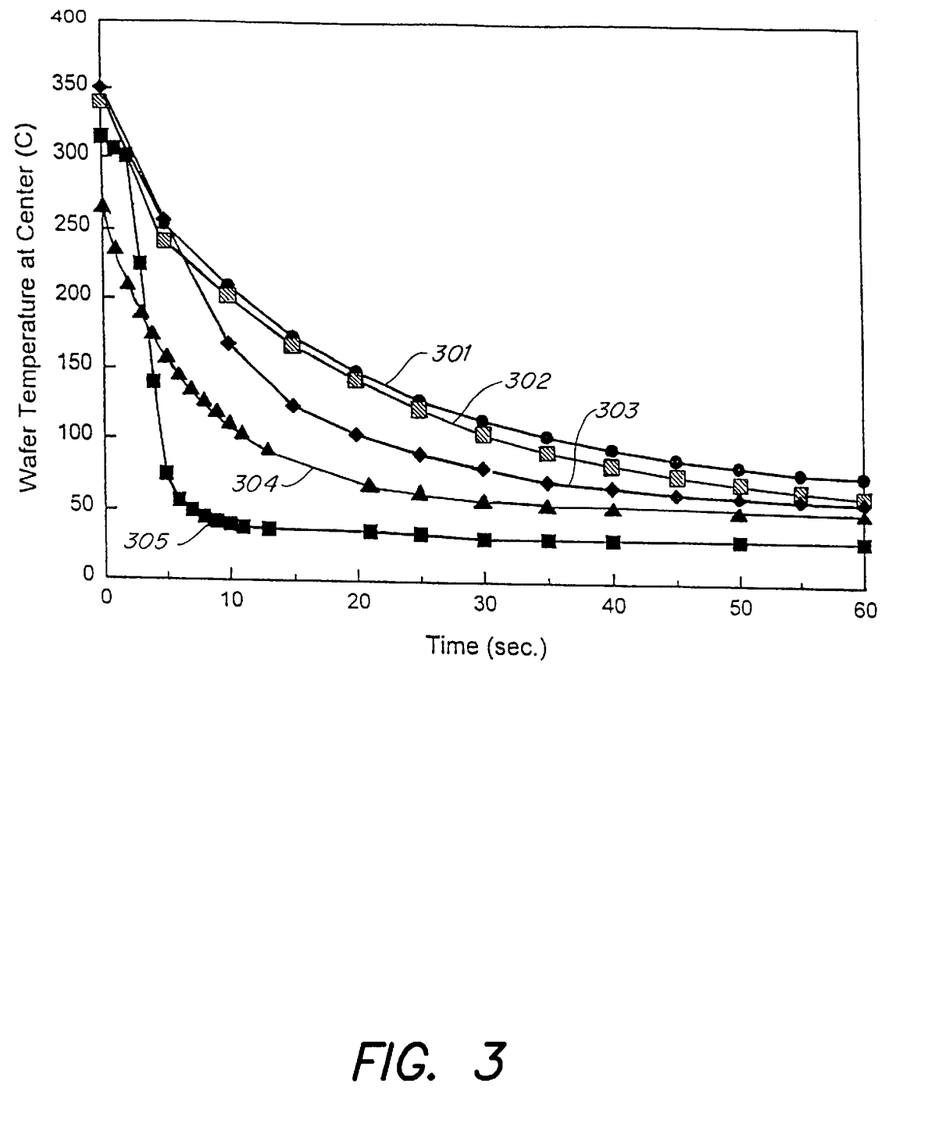
FIG. 3 is a graph of wafer temperature versus time for various cooling conditions within the heating and cooling apparatus of FIG. 1.

FIG. 3 is a graph of wafer temperature versus time for the various chamber 13 cooling conditions listed in TABLE 1 (below). To obtain the data plotted in these graphs, the substrate support 15 was heated to a temperature of 350° C. (e.g., to simulate a heating process performed just prior to a cooling process), the cold plate 39 was cooled to a temperature of 25° C. and the distance between the substrate support 15 and the cold plate 39 was about 40 mm. Wafers were held in direct contact with the heated substrate support 15 without employing the pins 27*a–c*.

TABLE 1

| CURVE # | COOLING CONDITIONS |
|---|---|
| 301 | 1. 150 s.l.m. $N_2$ purge through cold plate holes 39a-n;<br>2. Chamber pressure of about 760 Torr; and<br>3. 3 mm wafer-cold plate distance. |
| 302 | 1. 150 s.l.m. $N_2$ purge through cold plate holes 39a-n;<br>2. Chamber pressure of about 80 Torr;<br>3. 3 mm wafer-cold plate distance. |
| 303 | 1. 150 s.l.m. $N_2$ purge through cold plate holes 39a-n;<br>2. 10 s.l.m. $N_2$ purge on backside ot wafer;<br>3. Chamber pressure of about 760 Torr;<br>4. 3 mm wafer-cold plate distance. |
| 304 | 1. No $N_2$ flow;<br>2. Chamber pressure of about 760 Torr;<br>3. 0.25 mm wafer-cold plate distance. |
| 305 | 1. No $N_2$ flow;<br>2. Chamber pressure of about 47 Torr;<br>3. 0.45 mm wafer-cold plate distance. |

As can be seen with joint reference to FIG. 3 and TABLE 1, for a fixed wafer-to-cold plate distance (e.g., 3 mm for curves 301–303), reducing the pressure within the chamber 13 and flowing dry gas (e.g., $N_2$) through the holes 39*a–n* of the cold plate 39, as well as to the backside of the wafer 25, increases the cooling rate of the wafer 25. However, the distance between the wafer 25 and the cold plate 39 with optimized chamber pressure plays a more significant role in cooling a wafer than flowing a cool dry gas as shown by curve 304 which represents the cooling achieved with no $N_2$ purge through cold plate holes 39*a–n*, a 0.25 mm wafer-cold plate distance, and a 760 Torr chamber pressure; and by curve 305 which represents the cooling achieved with no $N_2$ purge through cold plate holes 39*a–n*, a 0.45 mm wafer-cold plate distance, and a 47 Torr chamber pressure.

Specifically, the present inventors have found that reduced chamber pressures (e.g., about 20–200 Torr) during cooling optimize the cooling process because reduced pressures continue to provide good thermal conduction for a small distance (e.g., less than 0.5 mm) between the wafer 25 and the cold plate 39. At the same time, reduced chamber pressures have been found to suppress heat transfer from the heated substrate support 15 to the wafer 25 which are preferably separated by about 25–125 mm (e.g., about 25–125 mm between the substrate support 15 and the cold plate 39). As can be seen from FIG. 3, cooling from 350° C. can require as much as about 20 seconds depending on the cooling conditions employed, but can be reduced to about 5 seconds for optimal cooling conditions (e.g., a chamber pressure of 47 Torr and a 0.45 mm wafer-cold plate distance). As can be seen by the differences between curves 301 and 302, the addition of a convective cooling component by flowing a gas through the cooling plate holes 39*a–n* has less of an impact on cooling than does reducing heat conduction between the heated substrate support 15 and the wafer 25 during cooling. As with heating, cooling appears to be predominately conduction dominated.

Figure 5:
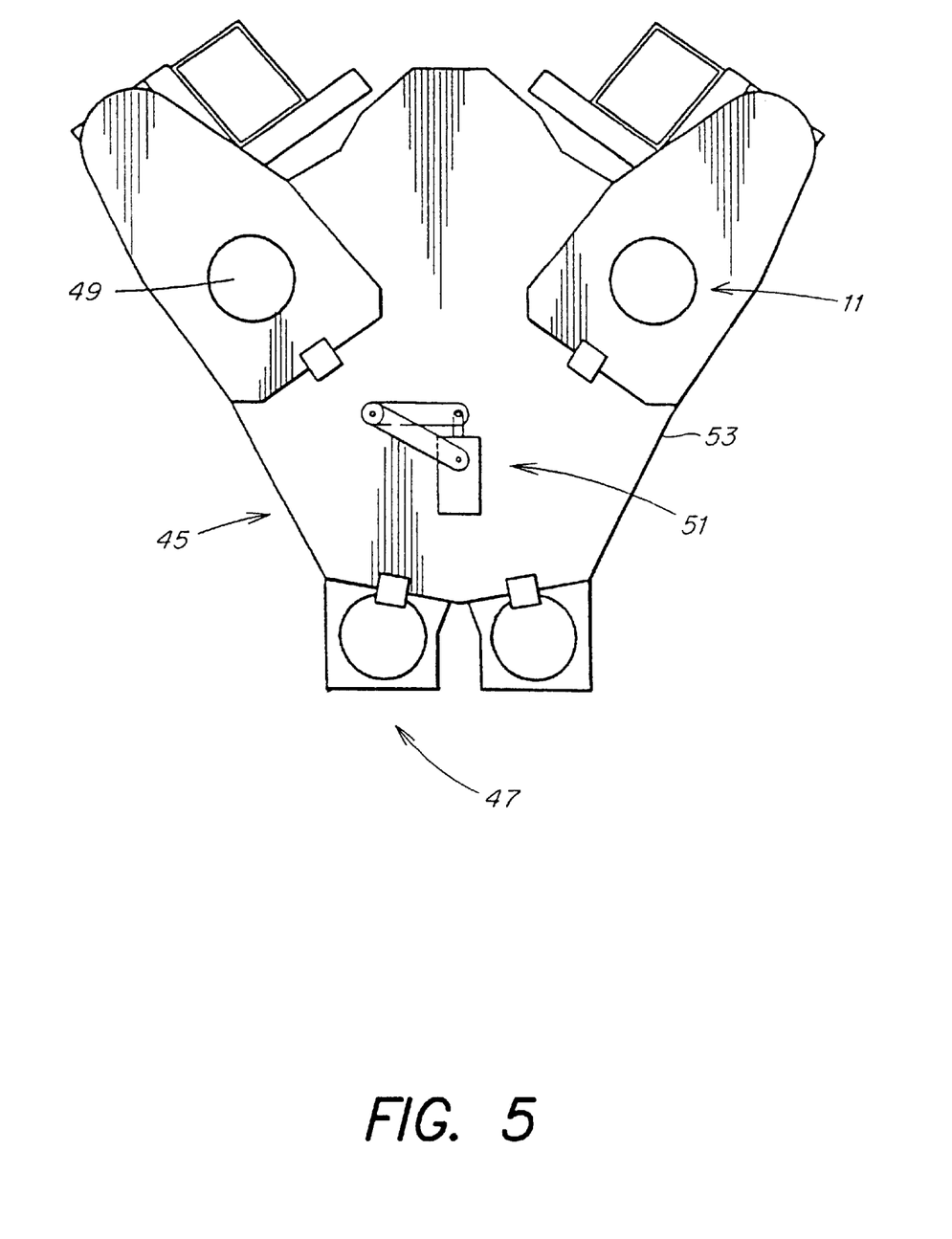
FIG. 5 is a top plan view of a fabrication tool that employs the inventive heating and cooling apparatus of FIG. 1.

Following the cooling process, the chamber 13 is vented with dry gas from the dry gas source 19 to a pressure of about 760 Torr (1 atmosphere) or is evacuated to a pressure required for wafer transfer into a fabrication system (as described below with reference to FIG. 5). The chamber isolation slit valve 41 opens and the transfer station wafer handler 43*a* reaches into the chamber 13 and extends under the wafer 25. Thereafter the wafer lift hoop 29 lowers (transferring the wafer 25 to the wafer handler 43*a*) and the wafer handler 43*a* retracts carrying the wafer 25 into the transfer station 43. To prevent contaminants from the transfer station 43 from entering the chamber 13 as the wafer 25 is transferred therefrom, the chamber 13 may be purged continuously with dry gas from the dry gas source 19 (typically at a flow rate of about 5–100 s.l.m.) while the slit valve 41 is open. After the wafer handler 43*a* retracts from the chamber 13 the slit valve 41 closes, and purging (if any) of the chamber 13 may be halted.

Figure 4:
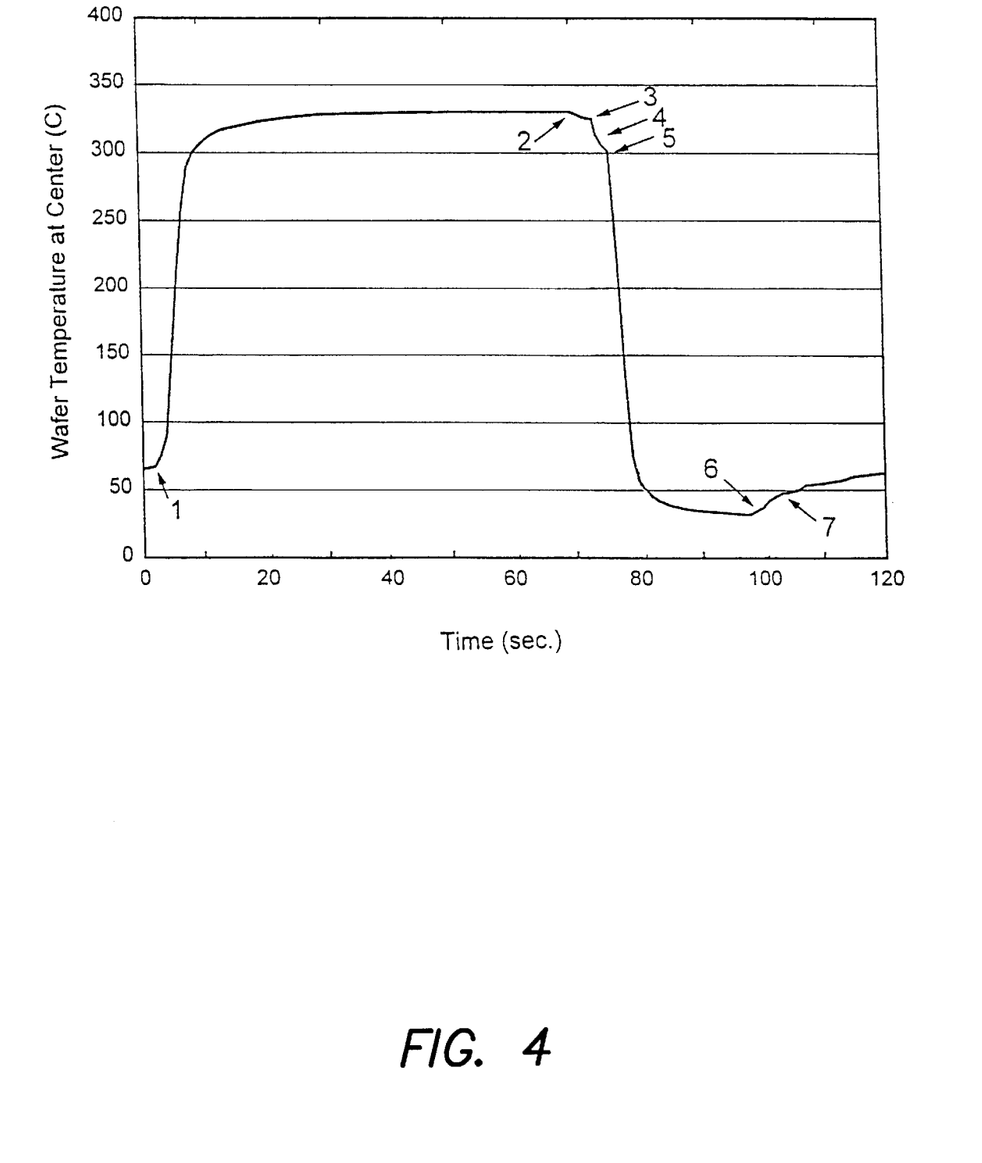
FIG. 4 is a graph of wafer temperature versus time during a typical annealing and cooling process within the heating and cooling apparatus of FIG. 1.

FIG. 4 is a graph of wafer temperature versus time during a typical annealing and cooling process within the heating and cooling apparatus 11 of FIG. 1. The substrate support 15 is pre-heated to a temperature of 340° C., the cold plate 39 is pre-cooled to a temperature of 25° C. and the chamber 13 is pre-conditioned to contain less than about 10 parts per million of oxygen (e.g., by purging or cycle purging the chamber 13 as previously described). The chamber 13 preferably is backfilled with a dry gas such as nitrogen to a pressure of about 760 Torr. With reference to FIG. 4, at time 1, the wafer 25 is placed directly on the heated substrate support 15 (without employing the pins 27*a–c*) via the wafer lift hoop 29, and between times 1 and 2 annealing is performed (e.g., at a chamber pressure of about 760 Torr). At time 2, the wafer 25 is lifted from the heated substrate support 15 via the wafer lift hoop 29, and at time 3 arrives at a position proximate the cold plate 39 (e.g., about 0.45 mm from the cold plate 39), beginning the wafer cooling cycle. At time 4, the rough pump 23 begins pumping the chamber 13. Pumping continues until time 5 when the pressure within the chamber 13 reaches about 47 Torr. Once the chamber pressure reaches about 47 Torr, the wafer 25 begins to cool rapidly (between times 5 and 6). At time 6 the cooling process ends and the chamber 13 is vented to atmospheric pressure with dry gas (e.g., $N_2$) from the dry gas source 19 (or is evacuated as described below with reference to FIG. 5). At time 7 the chamber isolation slit valve 41 opens and the wafer 25 is extracted from the chamber 13 as previously described. Note that if desired, the chamber 13 may be pumped by the rough pump 23 prior to time 4 (e.g., during wafer transfer from the substrate support 15 to the cooling plate 39). However, the present inventors have found that cooling is more efficient (e.g., is faster) when pumping of the chamber 13 is not performed until the wafer 25 has reached the cooling plate 39.

The heating and cooling apparatus 11 may be used as a stand alone heating and cooling system, separate from a fabrication system that couples multiple process chambers, or may be used as part of a fabrication system. For example, FIG. 5 is a top plan view of a fabrication system 45 that employs the inventive heating and cooling apparatus of FIG. 1. The fabrication system 45 comprises at least a first load lock 47, at least one process chamber 49, at least one wafer handler 51 and the inventive heating and cooling apparatus 11. The at least one wafer handler 51 resides within a transfer chamber 53 that couples the first load lock 47, the process chamber 49 and the inventive heating and cooling apparatus 11.

In operation, a wafer carrier containing at least one wafer is loaded into the first load lock 47, and the first load lock 47 is pumped to a desired vacuum level, typically set by the process to be performed within the process chamber 49 (e.g., slightly below atmospheric pressure for a subatmospheric CVD process such as low k dielectric deposition, at a low pressure for a PVD process, etc.). If the inventive heating and cooling chamber 11 is to be employed for annealing only, the wafer handler 51 extracts a first wafer from the first load lock 47 and transports it to the process chamber 49. An annealable process (e.g., low k dielectric film deposition, etc.) is performed on the wafer and the wafer is transferred via the wafer handler 51 to the inventive heating and cooling apparatus 11. A sealable port such as the slit valve 41 (FIG. 1A) on the chamber 13 opens allowing the wafer handler 51 to reach into the chamber 13 and deposit the first wafer on the heated substrate support 15, as previously described. The wafer handler 51 retracts and the slit valve 41 closes. The wafer is then heated and cooled in accordance with the invention as described with reference to FIGS. 1–4. After heating and cooling, the wafer is returned to the first load lock 47. The sequence repeats until each wafer within the wafer carrier has been processed and returned to the first load lock 47.

If the inventive heating and cooling chamber 11 is to be employed for degassing, the above sequence is reversed. Each wafer travels from the first load lock 47 to the inventive heating and cooling apparatus 11 and is degassed therein. Thereafter each wafer travels from the inventive heating and cooling apparatus 11 to the process chamber 49, has a process performed thereon, and then travels from the process chamber 49 to the first load lock 47 (either directly or after having a cooling step or an annealing and cooling step performed thereon within the heating and cooling apparatus 11). Note that many processes that require a degassing step also require a high vacuum level (e.g., PVD processes). Accordingly, the heating and cooling apparatus 11 may require a cryopump in addition to a rough pump so as to reach the high vacuum level (as set by the process chamber 49) required for the fabrication system 45.

The foregoing description discloses only the preferred embodiments of the invention, modifications of the above disclosed apparatus and method which fall within the scope of the invention will be readily apparent to those of ordinary skill in the art. For instance, although the components of the inventive heating and cooling apparatus and the configurations described herein are presently preferred, numerous variations may occur and yet remain within the scope of the invention. For example, heating may be performed in an upper or first side portion of the chamber 13 and cooling in a lower or second side portion of the chamber 13. The needle valve or flow controller and the isolation valves can be manually adjusted but are preferably computer controlled. The substrate support 15 may be resistively heated, heated by lamps (e.g., infrared lamps inside or outside of the chamber 13), heated from underneath or directly, or heated via any other known heating mechanism.

A substrate may be heated by either touching the substrate support 15 or merely by being held proximate the substrate support 15. Similarly, a substrate may be cooled by either touching the cold plate 39, or merely by being held in close proximity to the cold plate 39. A cooled substrate support or other cooling mechanism may be employed in place of the cold plate 39. Heating and/or cooling may be performed with a chamber pressure at or slightly above atmospheric pressure or with a reduced chamber pressure, with or without gas flowing through the cold plate 39.

The wafer lift mechanism may be motorized, pneumatic or employ any other known lifting mechanism (e.g., a wafer handler such as the wafer handler 43a). The wafer may be heated and then transferred via the lift mechanism to a supporting mechanism position proximate the cooling mechanism. One such supporting mechanism and transfer process thereto is disclosed in U.S. Pat. No. 5,951,770, issued Sep. 14, 1999, the entire disclosure of which is incorporated herein by this reference. Further, numerous objects other than wafers (for example liquid crystal display panels and glass plates) may benefit from the inventive process. In addition to nitrogen, any other non-oxidizing gas such as argon, helium, etc., may form all or part of the chamber 13's atmosphere during substrate heating, cooling and/or transfer or during chamber idle.

Accordingly, while the present invention has been disclosed in connection with the preferred embodiments thereof, it should be understood that other embodiments may fall within the spirit and scope of the invention, as defined by the following claims.

The invention claimed is:

1. A fabrication system comprising:
   at least one load lock;
   a transfer chamber coupled to the at least one load lock;
   at least one process chamber coupled to the transfer chamber;
   a heating and cooling chamber coupled to the transfer chamber, the heating and cooling chamber including:
     a heating mechanism adapted to heat a substrate positioned proximate the heating mechanism;
     a coolable member spaced from the heating mechanism and adapted to cool a substrate positioned proximate the coolable member, the coolable member being coolable by a cooling mechanism; and
     a transfer mechanism adapted to transfer a substrate between a position proximate the heating mechanism and a position proximate the coolable member; and
   a wafer handler disposed within the transfer chamber and adapted to transfer a substrate between the at least one load lock, the at least one process chamber and the heating and cooling chamber.

2. The system of claim 1 wherein the heating mechanism comprises a heated substrate support.

3. The system of claim 2 wherein the heated substrate support is adapted to support a substrate and to heat the supported substrate to a predetermined temperature.

4. The system of claim 1 wherein the heating mechanism and the coolable member are separated by about 1 to 5 inches.

5. The system of claim 1 wherein the coolable member comprises a cooling plate.

6. The system of claim 5 wherein the cooling plate comprises a cooling plate selected from the group consisting of a water cooled cooling plate and a refrigerant cooled cooling plate.

7. The system of claim 5 wherein the cooling plate comprises a plurality of holes adapted to allow a gas to flow through the cooling plate so as to cool the gas.

8. The system of claim 5 wherein the cooling plate may be cooled to between about 5 and 25° C.

9. The system of claim 1 wherein the transfer mechanism comprises a plurality of wafer lift pins.

10. The system of claim 1 wherein the transfer mechanism is adapted to transfer a substrate positioned proximate the heating mechanism to a position of less than about 0.02 inches from the coolable member.

11. The system of claim 1 further comprising a dry gas source coupled to the heating and cooling chamber and adapted to supply a dry gas thereto.

12. The system of claim 11 wherein the dry gas comprises a dry gas selected from the group consisting of approximately 100% $N_2$ and approximately 96% or greater $N_2$ with 4% or less $H_2$ both having less than about 5 parts per million of $O_2$.

13. The system of claim 11 wherein the coolable member comprises a plurality of holes adapted to allow a gas to flow through the coolable member so as to cool the gas and wherein the dry gas source is coupled to the coolable member and is adapted to supply a dry gas that flows through the plurality of holes of the coolable member.

14. The system of claim 11 further comprising a manifold having a plurality of holes adapted to allow a gas to flow through the manifold so as to diffuse the gas and wherein the dry gas source is coupled to the manifold and is adapted to supply a dry gas that flows through the manifold.

15. The system of claim 1 further comprising a pump coupled to the heating and cooling chamber and adapted to evacuate the heating and cooling chamber to a predetermined pressure.

16. The system of claim 15 having a controller coupled thereto, the controller being programmed to cause the pump to evacuate the heating and cooling chamber to a predetermined pressure during cooling of a substrate with the coolable member.

17. The system of claim 16 wherein the predetermined pressure is between about 20 and 200 Torr.

18. The system of claim 1 wherein the transfer mechanism is adapted to transfer a substrate between a position proximate the heating mechanism and a position proximate the coolable member by employing single-axis, linear motion.

19. A method of heating and cooling a substrate comprising:
(a) providing a fabrication system having:
   at least one load lock;
   a transfer chamber coupled to the at least one load lock;
   at least one process chamber coupled to the transfer chamber;
   a heating and cooling chamber coupled to the transfer chamber and having a heating mechanism and a coolable member that is coolable by a cooling mechanism; and
   a wafer handler disposed within the transfer chamber and adapted to transfer a substrate between the at least one load lock, the at least one process chamber and the heating and cooling chamber;
(b) loading a substrate into the at least one load lock;
(c) transferring the substrate from the at least one load lock to the transfer chamber;
(d) transferring the substrate from the transfer chamber to the at least one process chamber;
(e) processing the substrate within the at least one process chamber;
(f) transferring the substrate from the at least one process chamber to the transfer chamber;
(g) transferring the substrate from the transfer chamber to the heating and cooling chamber;
(h) positioning the substrate at a position proximate the heating mechanism;
(i) heating the substrate with the heating mechanism;
(j) transferring the substrate from the position proximate the heating mechanism to a position proximate the coolable member;
(k) cooling the substrate with the coolable member; and
(l) transferring the substrate from the heating and cooling chamber to the transfer chamber.

20. The method of claim 19 wherein steps (g)–(l) come before steps (d)–(f).

21. The method of claim 20 further comprising performing steps (g)–(l) before and after steps (d)–(f).

22. The method of claim 19 wherein steps (g)–(l) come after steps (d)–(f).

23. The method of claim 19 wherein positioning the substrate proximate the heating mechanism comprises placing the substrate on a heated substrate support.

24. The method of claim 19 wherein transferring the substrate from a position proximate the heating mechanism to a position proximate the coolable member comprises transferring the substrate from a position proximate the heating mechanism to a position proximate a cooling plate.

25. The method of claim 19 wherein transferring the substrate from a position proximate the heating mechanism to a position proximate the coolable member comprises transferring the substrate from a position proximate the heating mechanism to a position less than about 0.02 inches from the coolable member.

26. The method of claim 19 wherein cooling the substrate with the coolable member comprises cooling the substrate with the coolable member having a temperature between about 5 and 25° C.

27. The method of claim 19 further comprising flowing a dry gas into the heating and cooling chamber during at least one of heating and cooling the substrate.

28. The method of claim 19 further comprising flowing a dry gas through a plurality of holes within the coolable member during cooling the substrate.

29. The method of claim 19 further comprising evacuating the chamber to a predetermined pressure during cooling the substrate.

30. The method of claim 29 wherein evacuating the chamber to a predetermined pressure during cooling the substrate comprises evacuating the chamber to between about 20 and 200 Torr during cooling the substrate.

31. The method of claim 19 wherein heating the substrate with the heating mechanism comprises annealing the substrate.

32. The method of claim 19 wherein heating the substrate with the heating mechanism comprises degassing the substrate.

33. The method of claim 19 wherein transferring the substrate from the position proximate the heating mechanism to the position proximate the coolable member comprises transferring the substrate by employing single-axis, linear motion.

34. A fabrication system comprising:
at least one load lock;
a transfer chamber coupled to the at least one load lock;
at least one process chamber coupled to the transfer chamber;
a heating and cooling chamber coupled to the transfer chamber, the heating and cooling chamber including:
  a heating mechanism adapted to heat a substrate positioned proximate the heating mechanism;
  a cooling plate spaced from the heating mechanism and adapted to cool a substrate positioned proximate the cooling plate; and
  a transfer mechanism adapted to transfer a substrate between a position proximate the heating mechanism and a position proximate the cooling plate; and
  a wafer handler disposed within the transfer chamber and adapted to transfer a substrate between the at least one load lock, the at least one process chamber and the heating and cooling chamber.

35. The system of claim 34 wherein the cooling plate comprises a cooling plate selected from the group consisting of a water cooled cooling plate and a refrigerant cooled cooling plate.

36. The system of claim 34 wherein the cooling plate may be cooled to between about 5 and 25° C.

37. A method of heating and cooling a substrate comprising:
(a) providing a fabrication system having:
  at least one load lock;
  a transfer chamber coupled to the at least one load lock;
  at least one process chamber coupled to the transfer chamber;
  a heating and cooling chamber coupled to the transfer chamber and having a heating mechanism and a cooling plate; and
  a wafer handler disposed within the transfer chamber and adapted to transfer a substrate between the at least one load lock, the at least one process chamber and the heating and cooling chamber;
(b) loading a substrate into the at least one load lock;
(c) transferring the substrate from the at least one load lock to the transfer chamber;
(d) transferring the substrate from the transfer chamber to the at least one process chamber;
(e) processing the substrate within the at least one process chamber;
(f) transferring the substrate from the at least one process chamber to the transfer chamber;
(g) transferring the substrate from the transfer chamber to the heating and cooling chamber;
(h) positioning the substrate at a position proximate the heating mechanism;
(i) heating the substrate with the heating mechanism;
(j) transferring the substrate from the position proximate the heating mechanism to a position proximate the cooling plate;
(k) cooling the substrate with the cooling plate; and
(l) transferring the substrate from the heating and cooling chamber to the transfer chamber.

38. The method of claim 37 wherein steps (g)–(l) come before steps (d)–(f).

39. The method of claim 38 further comprising performing steps (g)–(l) before and after steps (d)–(f).

40. The method of claim 37 wherein steps (g)–(l) come after steps (d)–(f).

* * * * *